United States Patent
Minneman et al.

(10) Patent No.: US 9,153,939 B1
(45) Date of Patent: Oct. 6, 2015

(54) SYSTEM AND METHOD FOR GENERATING AND UTILIZING SAMPLE TRIGGER BLANKING TO OBVIATE SPURIOUS DATA AND INCREASE SWEEP RATE IN AN AKINETIC PATH-BASED SWEPT LASER

(71) Applicant: INSIGHT PHOTONIC SOLUTIONS, INC., Lafayette, CO (US)

(72) Inventors: Michael Minneman, Lafayette, CO (US); Michael Crawford, Lafayette, CO (US); Jason Ensher, Lafayette, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 14 days.

(21) Appl. No.: 14/211,524

(22) Filed: Mar. 14, 2014

Related U.S. Application Data

(60) Provisional application No. 61/787,485, filed on Mar. 15, 2013.

(51) Int. Cl.
*H01S 3/10* (2006.01)
*H01S 5/0683* (2006.01)
(Continued)

(52) U.S. Cl.
CPC .............. *H01S 5/0683* (2013.01); *H01S 5/06* (2013.01); *H01S 5/0607* (2013.01); *H01S 5/068* (2013.01);
(Continued)

(58) Field of Classification Search
CPC ....... H01S 5/06; H01S 5/0607; H01S 5/0614; H01S 5/068; H01S 5/06804; H01S 5/06808; H01S 5/0683; H01S 5/06835; H01S 5/0617; H01S 5/0014; H01S 5/0057; H01S 5/0622; H01S 5/0623; H01S 5/0625; H01S 5/06255; H01S 5/06812; H01S 2301/08

USPC ............... 372/20, 32, 38.02, 38.01, 29.01, 372/29.011, 29.02; 259/341.4, 344; 298/16, 298/32, 33
See application file for complete search history.

(56) References Cited

U.S. PATENT DOCUMENTS 6,870,629 B1 * 3/2005 Vogel et al. ................. 356/519
7,468,997 B2 12/2008 Jayaraman
(Continued)

OTHER PUBLICATIONS

Fujiwara et al., "140-nm Quasi-Continuous Fast Sweep Using SSG-DBR Lasers", IEEE Photonics Technology Letters, vol. 20, No. 12, Jun. 15, 2008, pp. 1015-1017.
(Continued)

*Primary Examiner* — Jessica Stultz
*Assistant Examiner* — Delma R Forde
(74) *Attorney, Agent, or Firm* — Renner, Otto, Boisselle and Sklar, LLC

(57) ABSTRACT

A system and method for triggering data acquisition in a semiconductor laser system including outputting electromagnetic energy from the semiconductor laser over a range of wavelengths according to a signaling path. The signaling path includes a plurality of discrete data inputs to the semiconductor laser for outputting electromagnetic energy over a range of wavelengths and the signaling path includes one or more perturbances in transitioning from one wavelength to another wavelength along the signaling path. A series of triggering signals are generated for input to a measurement system by the semiconductor laser. The series of triggering signals include a non-uniform period between at least a first triggering signal and an adjacent second triggering signal, and the non-uniform period corresponds to at least one perturbance. The electromagnetic energy output from the semiconductor laser is detected based on the series of triggering signals.

17 Claims, 5 Drawing Sheets

(51) Int. Cl.
*H01S 5/06* (2006.01)
*H01S 5/068* (2006.01)
*H01S 5/0625* (2006.01)

(52) U.S. Cl.
CPC ............. *H01S 5/0614* (2013.01); *H01S 5/0617* (2013.01); *H01S 5/0625* (2013.01); *H01S 5/06256* (2013.01); *H01S 5/06804* (2013.01); *H01S 5/06808* (2013.01); *H01S 5/06835* (2013.01)

(56) References Cited

U.S. PATENT DOCUMENTS

| | | | |
|---|---|---|---|
| 7,732,784 B2 | 6/2010 | Shimizu et al. | |
| 2013/0044312 A1* | 2/2013 | Minneman et al. | 356/51 |
| 2013/0046499 A1* | 2/2013 | Minneman et al. | 702/85 |
| 2013/0223461 A1* | 8/2013 | Ensher et al. | 372/38.02 |
| 2014/0036940 A1* | 2/2014 | Tanaka et al. | 372/20 |
| 2014/0177660 A1* | 6/2014 | Welford | 372/20 |
| 2015/0036705 A1* | 2/2015 | Tanaka et al. | 372/29.011 |
| 2015/0063383 A1* | 3/2015 | Tanaka et al. | 372/20 |

OTHER PUBLICATIONS

Derickson et al., "SGDBR single-chip wavelength tunable lasers for swept source OCT" in *Coherence Domain Optical Methods and Optical Coherence Tomography in Biomedicine XII*, edited by Izatt et. al., Proceedings of SPIE, vol. 6847 (SPIE, Bellingham, WA), 2008, 11 pages.

George et al., "High-Speed Concatenation of Frequency Ramps Using Sampled Grating Distributed Bragg Reflector Laser Diode Sources for OCT Resolution Enhancement" in *Coherence Domain Optical Methods and Optical Coherence Tomography in Biomedicine XIV*, edited by Izatt et al., Proceedings of SPIE, vol. 7554 (SPIE, Bellingham, WA), 2010, 8 pages.

O'Connor et al., "100 kHz Axial Scan Rate Swept-Wavelength OCT using Sampled Grating Distributed Bragg Reflector Lasers" in *Coherence Domain Optical Methods and Optical Coherence Tomography in Biomedicine XIII*, edited by Izatt et al., Proceedings of SPIE, vol. 7168 (SPIE, Bellingham, WA), 2009, 8 pages.

Kakuma et al., "24 mm depth range discretely swept optical frequency domain imaging in dentistry", Proc. SPIE, vol. 7162, 2009, 8 pages.

Amano et al., "Optical frequency-domain reflectometry with a rapid wavelength-scanning superstructure-grating distributed Bragg reflector laser", Applied Optics, vol. 44, No. 5, Feb. 10, 2005, pp. 808-816.

Kakuma et al., "Optical imaging of hard and soft dental tissues using discretely swept optical frequency domain reflectometry optical coherence tomography at wavelengths from 1560 to 1600 nm", Journal of Biomedical Optics, vol. 13(1), Jan./Feb. 2008, 6 pages.

* cited by examiner

SYSTEM AND METHOD FOR GENERATING AND UTILIZING SAMPLE TRIGGER BLANKING TO OBVIATE SPURIOUS DATA AND INCREASE SWEEP RATE IN AN AKINETIC PATH-BASED SWEPT LASER

RELATED APPLICATIONS

This application is a Non-Provisional of the U.S. Application No. 61/787,485 filed Mar. 15, 2013, which is hereby incorporated herein by reference in its entirety.

TECHNICAL FIELD

The present invention relates generally to a system and a method for generating and utilizing sample trigger blanking to obviate spurious data and increase sweep rate in an akinetic path-based swept laser.

BACKGROUND

A tunable laser is one in which the wavelength may be varied over time in a predictable manner. In the past, conventional tunable lasers have utilized mechanical movement as the basis for wavelength tuning. Such mechanical movement may be induced by a number of devices including, for example: a grating that may be tilted to generate different wavelength reflection into the laser cavity; a mircoelectro-mechancial (MEMs) device that deflects to generate the wavelength change; and a filter that may be tilted to generate the wavelength change.

A new category of tunable laser based on an all-electronic tuning mechanism is now being utilized, which can tune without mechanical movement. These akinetic lasers have many useful qualities, including high speed, flexible tuning, and good optical quality. Lasers of this type have so far all been based on a semiconductor structure similar to the sample grating distributed Bragg reflector (SG-DBR), or sampled grating distributed Bragg reflector.

SUMMARY

The tuning of these akinetic devices is not based on a single monotonic or linear sweep of a control parameter (as in kinetic lasers), but rather a discontinuous series of continuous paths of one or more control parameters. When the laser is transitioned from one path to another, it is common for the laser to take some time to make this transition. If the sweep is very slow, these slight perturbances in the transition are not pertinent. During high-speed sweeps, though, knowing when and how long these perturbances can be critical.

To interact with a measurement system that may be interrogating the optical signal response based on the output of the laser, in kinetic lasers the measurement is generally made in equal-time intervals, and any difference from perfect linearity of optical frequency vs. time is made using post processing and a separate signal indicating equal optical frequency intervals. Alternatively, an optical circuit (e.g., a Mach-Zehnder interferometer), which outputs signals on equally-spaced optical frequency intervals, is used to trigger the measurement hardware for a kinetic laser system. Neither of these approaches will resolve the perturbances issue with the akinetic laser.

One aspect of the present disclosure relates to an electronic signal being generated during the sweep of the laser when the electronic signal corresponds to a correct wavelength output of the laser, and importantly this signal is used to trigger the measurement hardware. Instead of creating a continuous stream of trigger signals, as set forth above with respect to kinetic lasers, the akinetic laser generates a discontinuous stream of triggers, with gaps in the trigger stream that are synchronized with the perturbances. This can then allow the measurement hardware to make measurements only at those points which represent valid wavelength points. This results in increased sweep rate with less spurious data being detected and/or stored for processing.

Alternatively or additionally, the signaling path corresponds to a prescribed signaling path based on one or more known perturbances in transitioning from one wavelength to another wavelength.

Alternatively or additionally, a prescribed signaling path is selected to minimize traversal of a quantity of known perturbances in discretely sweeping over the range of wavelengths.

Alternatively or additionally, a prescribed signaling path is selected to minimize an amplitude associated with a quantity of known perturbances in discretely sweeping over the range of wavelengths.

Alternatively or additionally, the signaling path includes discrete data inputs for outputting electromagnetic energy within a range of wavelengths from about 1502 to about 1604 nanometers.

Alternatively or additionally, the signaling path includes discrete data inputs for outputting electromagnetic energy within a range of wavelengths from about 1250 to about 1400 nanometers.

Alternatively or additionally, the signaling path includes discrete data inputs for outputting electromagnetic energy within a range of wavelengths from about 1000 to about 1000 nanometers.

Alternatively or additionally, the discrete data inputs include at least one of a front mirror current and a back mirror current.

Alternatively or additionally, the discrete data inputs further includes at least one of a phase current and a semiconductor optical amplitude.

A further aspect of the disclosure relates to a method for triggering data acquisition in a semiconductor laser having one or more known perturbances in a data path, the method including: outputting electromagnetic energy from the semiconductor laser over a range of wavelengths according to a signaling path, wherein the signaling path includes a plurality of discrete data inputs to the semiconductor laser for outputting electromagnetic energy over a range of wavelengths and the signaling path includes one or more perturbances in transitioning from any one wavelength to another wavelength along the signaling path; generating a series of triggering signals for input to a measurement system by the semiconductor laser, wherein the series of triggering signals include a non-uniform period between at least a first triggering signal and an adjacent second triggering signal, and the non-uniform period corresponds to at least one perturbance; and detecting the electromagnetic energy output from the semiconductor laser based on the series of triggering signals.

Alternatively or additionally, the measurement system includes a detector configured to detect the electromagnetic energy output from the semiconductor laser based on the series of triggering signals.

Alternatively or additionally, the signaling path corresponds to a prescribed signaling path based on one or more known perturbances in transitioning from one wavelength to another wavelength.

Alternatively or additionally, the prescribed signaling path is selected to minimize traversal of a quantity of known perturbances in discretely sweeping over the range of wavelengths.

Alternatively or additionally, the prescribed signaling path is selected to minimize an amplitude associated with a quantity of known perturbances in discretely sweeping over the range of wavelengths.

Alternatively or additionally, the series of triggering signals include a non-uniform period between at least a first triggering signal and an adjacent second triggering signal, and the non-uniform period corresponds to at least one perturbance.

Alternatively or additionally, the discrete data inputs include at least one of a front mirror current and a back mirror current.

Alternatively or additionally, the discrete data inputs further includes at least one of a phase current and a semiconductor optical amplitude.

Another aspect of the present disclosure relates to a semiconductor laser system, the system including: a semiconductor laser configured to output electromagnetic energy discretely along a signaling path over a range of wavelengths, and to generate a series of triggering signals, wherein the series of triggering signals include a non-uniform period between at least a first triggering signal and an adjacent second triggering signal, and the non-uniform period corresponds to at least one perturbance; a measurement system configured to receive triggering signals and detect the electromagnet energy output from the semiconductor laser based on the received triggering signals; and a controller configured to output discrete data inputs to the semiconductor laser in order for the semiconductor laser to output electromagnetic energy in discrete wavelength steps along the signaling path.

A number of features are described herein with respect to embodiments of the invention. It will be appreciated that features described with respect to a given embodiment also may be employed in connection with other embodiments.

The invention comprises the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1:
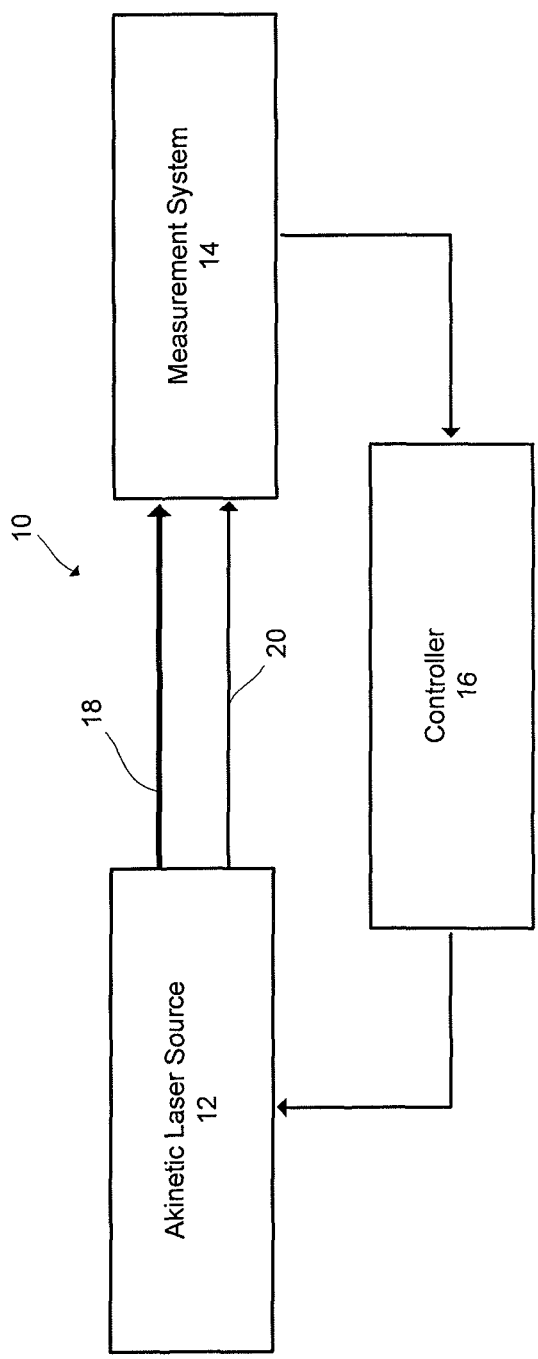
FIG. 1 illustrates an exemplary system in accordance with aspects of the present disclosure.

Referring to FIG. 1, an optical testing system 10 (also referred to as optical measurement system) is illustrated. The optical testing system 10 includes an electromagnetic energy source 12, a measurement system 14, and a controller 16. The system 10 may be used to perform a variety of functions including, for example, characterizing a device under test; optical coherence tomography (OCT) and optical frequency domain reflectometry (OFDR) applications and the like.

The electromagnetic energy source 12 may be an akinetic laser. The akinetic laser may be a semiconductor laser. For example the electromagnetic energy source 12 may be a Semiconductor Monolithic Tunable Laser Source (SMTLS). SMTLS's have a characteristic sweep that is very short in time. However, the sweep may include potentially impactful non-linearities in the wavelength sweep. The energy source 12 provides a laser beam (sometimes referred to as light but may be other electromagnetic energy) 18 as incident electromagnetic energy to a specimen (not shown) and detected by the measurement system 14. It will be appreciated that other types of electromagnetic sources may be used and fall within the spirit and scope of the present disclosure.

Figure 2:
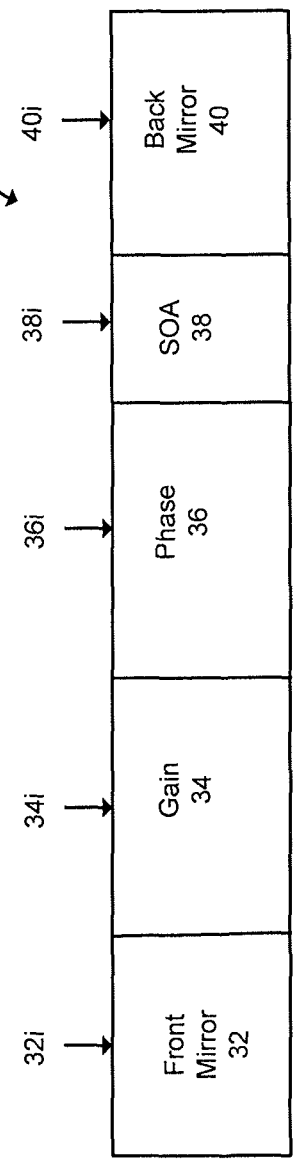
FIG. 2 illustrates an exemplary laser source in accordance with aspects of the present disclosure.

Referring to FIG. 2, an exemplary SMTLS 30 is shown. The SMTLS 30 includes the following sections: a front mirror section 32, a gain section 34, a phase section 36, a semiconductor optical amplifier (SOA) section 38 and a back mirror section 40. Each of these sections is configured to receive input signals (32$i$, 34$i$, 36$i$, 38$i$ and 40$i$, where "i" is indicative of "input"). Generally, the controller 16 is configured to output the desired inputs to the various sections of the SMTLS 30 in order to control operation of the SMTLS. Typically, the controller 16 outputs currents and/or voltage signals to the various inputs (e.g., 32$i$, 34$i$, 36$i$, 38$i$, and 40$i$) to change one or more characteristics of electromagnetic radiation output from the SMTLS.

Figure 3:
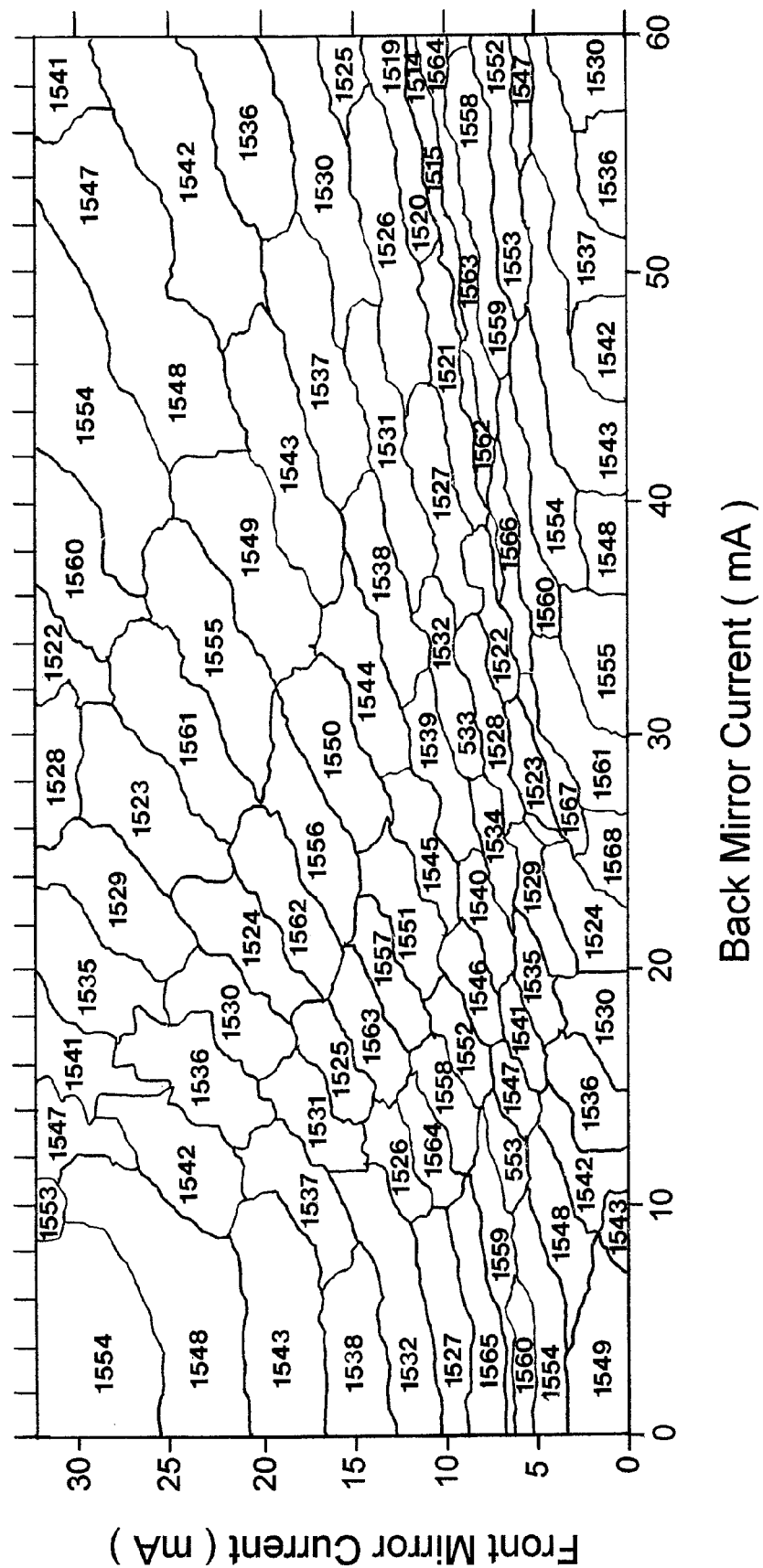
FIG. 3 is an exemplary chart of a Tuning Map-Wavelength vs. Mirror Excitation with front mirror current (mA) versus back mirror current (mA).

SMTLSs have wavelength regions associated with combinations of back mirror drive (e.g., 40$i$) and front mirror drive (e.g., 32$i$) currents. The complexity of the wavelength versus current map is shown in the FIG. 3. SMTLS devices were defined and developed to allow one of an array of specific wavelengths to be output, for example allowing selection of any one of the standard (ITU) wavelengths.

Work has been done in the past to allow fast switching of an SMTLS laser from one wavelength to another wavelength, anywhere in the tuning range of the laser, as discussed in U.S. Patent Application Publication 2009/0059972. Prior art involves using knowledge of the initial and final wavelength, and the currents associated with each wavelength, as well as feedback control systems to quickly lock the laser to its destination wavelength. This methodology is useful for applications in telecommunications that require discrete changes from one wavelength to another, destination wavelength.

In other applications such as swept-wavelength test of telecommunications components, remote sensing and optical coherence tomography, there are many motivations to operate the laser not as a wavelength-switching device, but rather as a wavelength-sweeping device. A wavelength sweep, as used in this disclosure, refers to a discrete (or step-wise continuous) movement over time from one wavelength to another, preferably in a linear, monotonic fashion.

The first challenge to sweeping a SMTLS is to determine how to tune the multi-section laser structure in a continuous manner. As discussed above, each section of the laser is controlled by a parameter such as current or voltage, leading to a complex multi-variable control space. By measuring the wavelength of the laser at a plurality of tuning currents (such as the front mirror, the back mirror and phase section of the laser) a continuous signaling path can be determined that traverses from lower wavelength to higher wavelength. Tuning paths are illustrated by the discrete lines labeled (a-i) in FIG. 4. Starting on line labeled (a), a set of front and back mirror currents may be selected that tunes the laser continuously in wavelength from high wavelength to successively lower wavelengths along lines (b), (c), etc. to line (h).

Figure 4:
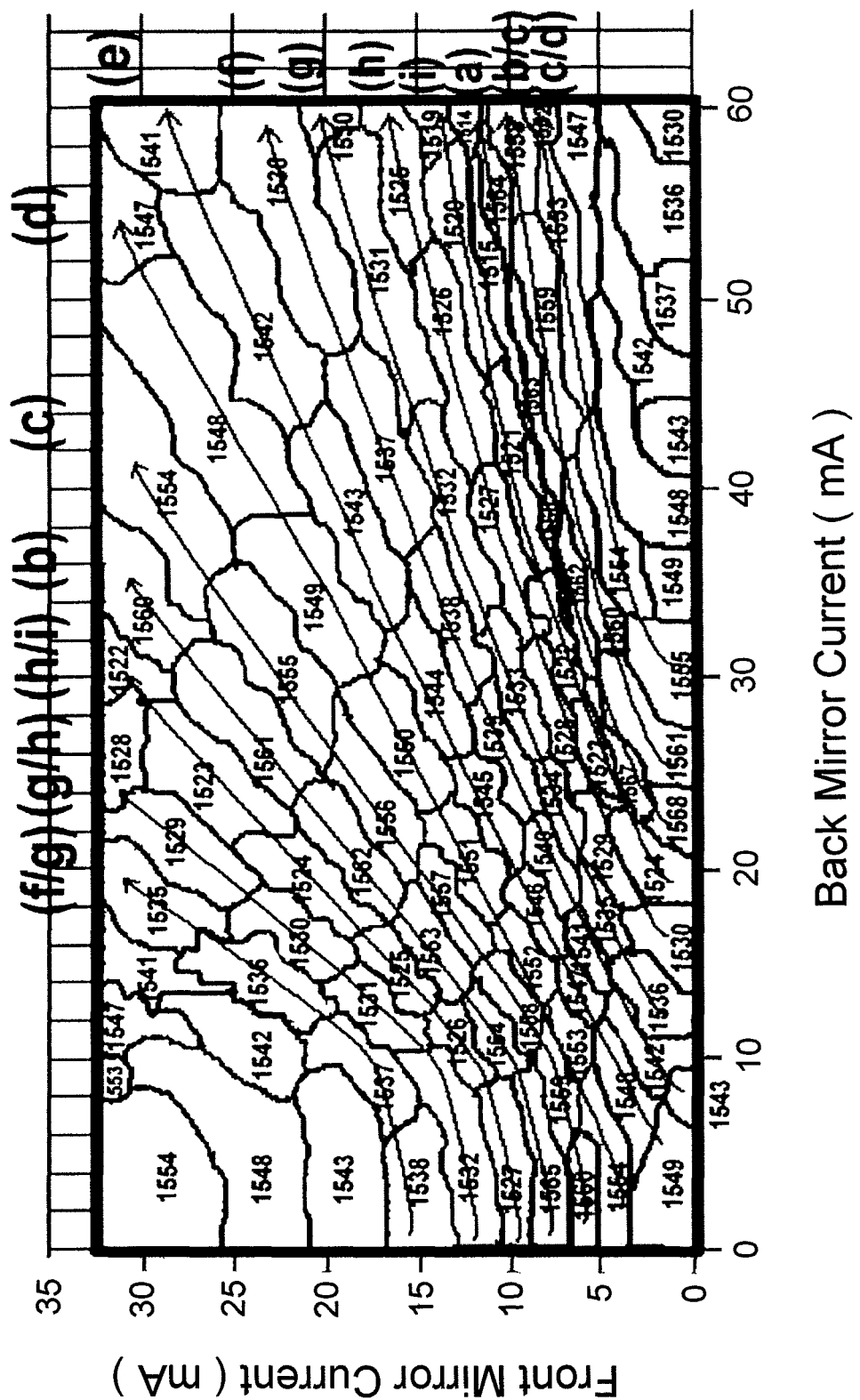
FIG. 4 is an exemplary Tuning Map with Rough Mirror Sweep Paths plotted on the exemplary chart of FIG. 3.

Each enclosed region in FIG. 4 represents a mode of the laser. At the boundary of each region, a mode hop occurs. As an example a mode hop in an SMTLS laser may be 350 picometers (pm) long. The magnitude of the mode hop may be controlled with the phase current. However, changing the phase current alters the details of the wavelength map in FIG. 4. Preventing wavelength discontinuities in an SMTLS requires understanding how to adjust multiple control parameters across the wavelength sweep of the SMTLS.

A signaling path includes a plurality of discrete data inputs (e.g., any combination of front mirror and corresponding back mirror, phase, SOA and/or gain currents and/or voltages) to the semiconductor laser for outputting electromagnetic energy over a range of wavelengths. As discussed above, when traversing from one mode to another the signaling path may include one or more perturbances (also referred to herein as non-linearities) in transitioning from one wavelength to another wavelength along the signaling path. The signaling path may include discrete data inputs for outputting electromagnetic energy within a range of wavelengths from about 1502 to about 1604 nanometers, for example. Other exemplary ranges include: from about 1250 to 1400 nanometers; and from about 1000 to 1100 nanometers.

In one embodiment, the signaling path may correspond to a prescribed signaling path based on one or more known perturbances in transitioning from one wavelength to another wavelength. In another embodiment, a prescribed signaling path is selected to minimize traversal of a quantity of known perturbances in discretely sweeping over the range of wavelengths. In yet another embodiment, a prescribed signaling path is selected to minimize amplitude associated with a quantity of known perturbances in discretely sweeping over the range of wavelengths.

As set forth above, the electromagnetic energy source 12 provides electromagnetic energy over a range of wavelengths. The range may include a number of distinct wavelengths that are between respective wavelength values at respective opposite ends of the range. The wavelength range may be the visible range of wavelengths or part of the visible range, may be in the ultraviolet, infrared, or some other range, or may be a combination or part or all of the mentioned and/or other ranges. The range may be continuous or may include discontinuous portions. One of ordinary skill in the art will readily appreciate that the disclosure may be used with other wavelengths and wavelength ranges.

Figure 5:
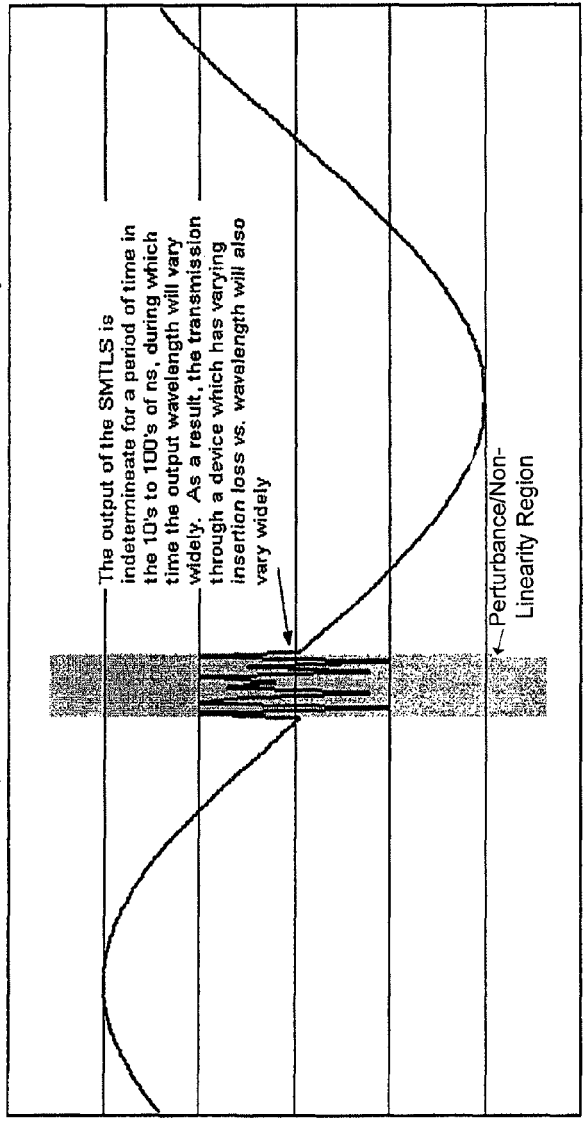
FIG. 5 is an exemplary discontinuity (non-linearity) in accordance with aspects of the present disclosure.

One aspect of the present disclosure is for the energy source 12 to provide a triggering signal 20 to the measurement system to increase sweep rate and reduce spurious data. The triggering signal 20 is utilized to account for perturbances and/or discontinuities occurring when transitioning from one wavelength to another wavelength. An exemplary perturbance and/or discontinuity is illustrated in FIG. 5. In FIG. 5, instead of smooth transition from the one wavelength to another wavelength, the measurement system 14 detects one or more non-linearities that are not representative of the actual results at those predicted wavelengths. In addition, there are potentially large amplitude variations that can occur during these non-linearities in wavelength (due to relatively high change in loss versus wavelength of a measured device in the vicinity of the non-linearity), which can cause the measurements immediately following the non-linearity to be incorrect due to explicit or implicit filtering of the signal. For example, the signal may jump to a much larger signal during a non-linearity, and even after the non-linearity, the signal may not have settled back to the nominal level due to filter settling time.

To account for these situations, one aspect of the present disclosure is to provide the triggering signal 20 to the measurement system 14. The triggering signal 20 is used to indicate a valid wavelength is being output by the energy source 12. Instead of creating a continuous stream of trigger signals like conventional systems require, the controller 16 causes the energy source 12 and/or the controller 16 generates a discontinuous stream of triggers with gaps in the trigger stream. The gaps in the trigger stream are synchronized with the perturbances, which enables the measurement system 14 to make measurements only at those point that represent valid wavelength points.

Figure 6:
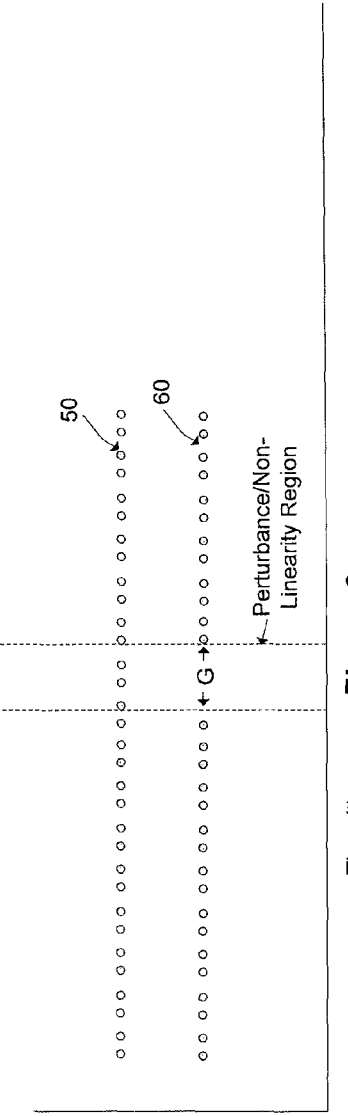
FIG. 6 is an exemplary triggering chart illustrating conventional triggering and triggering in accordance with aspects of the present disclosure.

FIG. 6 illustrates an exemplary conventional triggering stream 50 and a triggering stream 60 in accordance with aspects of the present disclosure. In conventional kinetic lasers, in order to interact with measurement hardware that may be interrogating the optical signal response based on the output of the laser, the measurement is generally made in equal-time intervals and any difference from the perfect linearity is made using post processing and a separate signal indicating equal wavelength intervals. Alternatively, the conventional triggering stream 50 may be an optical circuit that may be generated from a Mach-Zehnder interferometer or the like. The optical circuit outputs triggering signals on equally-spaced frequency intervals that may be used to trigger the measurement system to acquire data.

Neither of the above approaches resolves the perturbance issues that occur with akinetic lasers. One aspect of the claimed disclosure for generating an electronic signal (e.g., triggering signal) when the correct wavelength is output from the source 12. The electronic signal is used to trigger the measurement system 14 to make any desired measurements. Instead of creating a continuous stream of trigger signals, as discussed above with respect to trigger stream 50, the source 12 generates a discontinuous stream of triggers 60, with one or more gaps (G) in the trigger stream that are synchronized with the perturbances. For example, the period between one or more of the trigger signals in the stream of triggers may be non-uniform. Thus, the measurement system 14 is enabled to make measurements only at those points that represent valid wavelength points. A person of ordinary skill in the art will readily appreciate that the illustration in FIG. 6 is a simplistic illustration and there may be signaling paths that include multiple perturbances and/or non-linearities.

Figure 7:
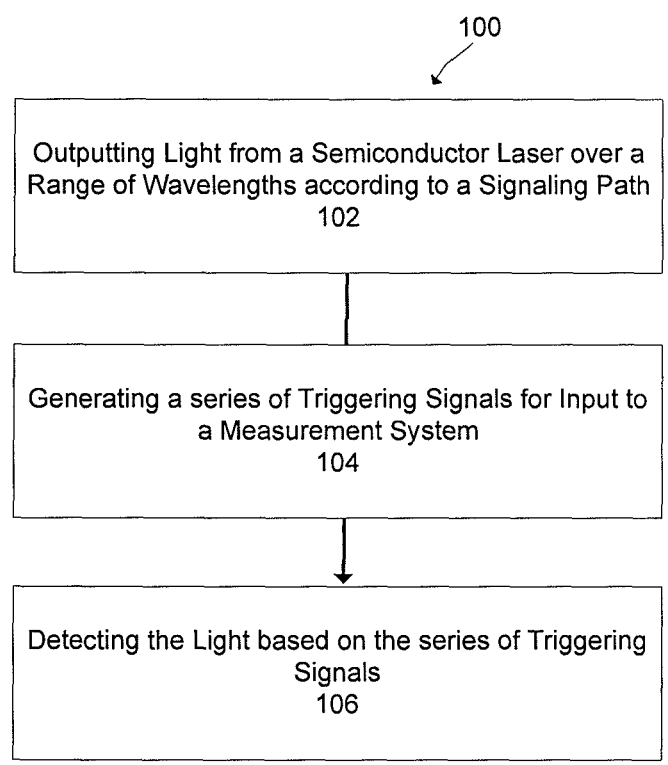
FIG. 7 is an exemplary method in accordance with aspects of the present disclosure.

An exemplary method 100 for triggering data acquisition in a semiconductor laser having one or more known perturbances in a data path is illustrated in FIG. 7. At block 102, the method includes outputting electromagnetic energy from the semiconductor laser over a range of wavelengths according to a signaling path. The signaling path includes a plurality of discrete data inputs to the semiconductor laser for outputting electromagnetic energy over a range of wavelengths and the signaling path includes one or more perturbances in transitioning from one wavelength to another wavelength along the signaling path.

At block 104, a series of triggering signals is generated for input to a measurement system by the semiconductor laser. The series of triggering signals include a non-uniform period between at least a first triggering signal and an adjacent second triggering signal, and the non-uniform period corresponds to at least one perturbance.

At block 106, the electromagnetic energy output from the semiconductor laser is detected based on the series of triggering signals. For example, the measurement system 14 is configured to detect signals received from the source 12 based on the triggering signals sent from the laser source 12 and/or the controller.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A method for triggering data acquisition in a semiconductor laser having one or more known perturbances in a data path, the method comprising:
   outputting electromagnetic energy from the semiconductor laser over a range of wavelengths according to a signaling path, wherein the signaling path includes a plurality of discrete data inputs to the semiconductor laser for outputting electromagnetic energy over a range of wavelengths and the signaling path includes one or more perturbances in transitioning from one wavelength to another wavelength along the signaling path;
   generating a series of triggering signals for input to a measurement system by the semiconductor laser, wherein the series of triggering signals include a non-uniform period between at least a first triggering signal and an adjacent second triggering signal, and the non-uniform period corresponds to at least one perturbance; and
   detecting the electromagnetic energy output from the semiconductor laser based on the series of triggering signals.

2. The method of claim 1, wherein the signaling path corresponds to a prescribed signaling path based on one or more known perturbances in transitioning from one wavelength to another wavelength.

3. The method of claim 2, wherein a prescribed signaling path is selected to minimize traversal of a quantity of known perturbances in discretely sweeping over the range of wavelengths.

4. The method of claim 2, wherein a prescribed signaling path is selected to minimize an amplitude associated with a quantity of known perturbances in discretely sweeping over the range of wavelengths.

5. The method of claim 1, wherein the signaling path includes discrete data inputs for outputting electromagnetic energy within a range of wavelengths from about 1502 to about 1604 nanometers.

6. The method of claim 1, wherein the signaling path includes discrete data inputs for outputting electromagnetic energy within a range of wavelengths from about 1250 to about 1400 nanometers.

7. The method of claim 1, wherein the signaling path includes discrete data inputs for outputting electromagnetic energy within a range of wavelengths from about 1000 to about 1000 nanometers.

8. The method of claim 1, wherein the discrete data inputs include at least one of a front mirror current and a back mirror current.

9. The method of claim 8, wherein the discrete data inputs further includes at least one of a phase current and a semiconductor optical amplitude.

10. A semiconductor laser system, the system comprising:
    a semiconductor laser configured to output electromagnetic energy discretely along a signaling path over a range of wavelengths, and to generate a series of triggering signals, wherein the series of triggering signals include a non-uniform period between at least a first triggering signal and an adjacent second triggering signal, and the non-uniform period corresponds to at least one perturbance;
    a measurement system configured to receive triggering signals and detect the electromagnet energy output from the semiconductor laser based on the received triggering signals; and
    a controller configured to output discrete data inputs to the semiconductor laser in order for the semiconductor laser to output electromagnet energy discretely along the signaling path.

11. The system of claim 10, wherein the measurement system includes a detector configured to detect the electromagnetic energy output from the semiconductor laser based on the series of triggering signals.

12. The method of claim 10, wherein the signaling path corresponds to a prescribed signaling path based on one or more known perturbances in transitioning from one wavelength to another wavelength.

13. The method of claim 12, wherein the prescribed signaling path is selected to minimize traversal of a quantity of known perturbances in discretely sweeping over the range of wavelengths.

14. The method of claim 12, wherein the prescribed signaling path is selected to minimize an amplitude associated with a quantity of known perturbances in discretely sweeping over the range of wavelengths.

15. The method of claim 10, wherein the series of triggering signals include a non-uniform period between at least a first triggering signal and an adjacent second triggering signal, and the non-uniform period corresponds to at least one perturbance.

16. The method of claim 10, wherein the discrete data inputs include at least one of a front mirror current and a back mirror current.

17. The method of claim 10, wherein the discrete data inputs further includes at least one of a phase current and a semiconductor optical amplitude.

* * * * *